US009627278B2

(12) United States Patent
Basker et al.

(10) Patent No.: US 9,627,278 B2
(45) Date of Patent: Apr. 18, 2017

(54) METHOD OF SOURCE/DRAIN HEIGHT CONTROL IN DUAL EPI FINFET FORMATION

(71) Applicant: International Business Machines Corporation, Armonk, NY (US)

(72) Inventors: Veeraraghavan Basker, Schenectady, NY (US); Kangguo Cheng, Schenectady, NY (US); Ali Khakifirooz, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/741,418

(22) Filed: Jun. 16, 2015

(65) Prior Publication Data

US 2016/0372383 A1 Dec. 22, 2016

(51) Int. Cl.
*H01L 21/84* (2006.01)
*H01L 21/8238* (2006.01)
*H01L 21/265* (2006.01)
*H01L 21/324* (2006.01)
*H01L 29/45* (2006.01)

(52) U.S. Cl.
CPC ...... *H01L 21/845* (2013.01); *H01L 21/26506* (2013.01); *H01L 21/324* (2013.01); *H01L 21/823814* (2013.01); *H01L 21/823821* (2013.01); *H01L 21/823864* (2013.01); *H01L 29/456* (2013.01)

(58) Field of Classification Search
CPC ............................ H01L 29/785; H01L 21/845
See application file for complete search history.

(56) References Cited

U.S. PATENT DOCUMENTS

| 8,569,152 | B1 | 10/2013 | Basker | |
| 2011/0101455 | A1* | 5/2011 | Basker | H01L 21/26586 257/347 |
| 2011/0210393 | A1 | 9/2011 | Chen et al. | |
| 2012/0018730 | A1* | 1/2012 | Kanakasabapathy | H01L 29/66795 257/66 |
| 2013/0200455 | A1 | 8/2013 | Lo et al. | |
| 2013/0319613 | A1 | 12/2013 | Basker et al. | |
| 2015/0076608 | A1 | 3/2015 | Cheng et al. | |
| 2015/0084101 | A1 | 3/2015 | Adam et al. | |

(Continued)

OTHER PUBLICATIONS

Kah-Wee Ang, "Towards 3-Dimensional (3D) CMOS Scaling," SEMATECH Symposium, Jun. 22, 2011.

*Primary Examiner* — Zandra Smith
*Assistant Examiner* — Evan Clinton
(74) *Attorney, Agent, or Firm* — Law Office of Charles W. Peterson, Jr.; Steven J. Meyers

(57) ABSTRACT

A method of forming field effect transistors (FETs), and forming integrated circuit (IC) chip including the FETs. Gates are formed on said semiconductor fins to define multi fin field effect transistors (FinFETs). Dielectric sidewalls on fins protect the sidewalls while the surface is damaged intentionally, e.g., with an implant that leaves source/drain junctions undisturbed. After removing the dielectric sidewalls semiconductor material is grown epitaxially on the sidewalls with the damage retarding growth on the surface. The epi-growth bridges between fins in the same FET. After the damage is repaired, chip processing continues normally.

19 Claims, 5 Drawing Sheets

(56) References Cited

U.S. PATENT DOCUMENTS

| | | |
|---|---|---|
| 2015/0102422 A1 | 4/2015 | Cai et al. |
| 2015/0102454 A1 | 4/2015 | Cheng et al. |
| 2015/0194523 A1* | 7/2015 | Kim .................... H01L 29/7848 |
| | | 257/192 |
| 2015/0287810 A1* | 10/2015 | Kerber .............. H01L 29/66795 |
| | | 257/192 |

* cited by examiner

METHOD OF SOURCE/DRAIN HEIGHT CONTROL IN DUAL EPI FINFET FORMATION

BACKGROUND OF THE INVENTION

Field of the Invention

The present invention is related to semiconductor devices and manufacturing, and more particularly, to forming fin field effect transistors (FinFETs) with multiple fins on semiconductor wafers and methods of manufacturing Integrated Circuits (ICs) with circuits including multi-fin FinFETs.

Background Description

Integrated Circuit (IC) chip density and performance are primary semiconductor technology development goals. Semiconductor technology and chip manufacturing advances have improved performance through a steady increase of on-chip clock frequencies, coupled with a corresponding decrease in chip supply voltage resulting in part from reduced chip feature size.

To minimize power consumption, typical ICs are made in the well-known complementary insulated gate field effect transistor (FET) technology known as CMOS. A typical CMOS circuit includes paired complementary devices, i.e., an n-type FET (NFET) paired with a corresponding p-type FET (PFET), usually gated by the same signal. For example, a CMOS inverter is a series connected PFET and NFET pair that are connected between a power supply voltage ($V_{dd}$) and ground (GND). The pair of devices have operating characteristics that are, essentially, opposite to each other. So, when one device (e.g., the NFET) is on (ideally modeled as a closed switch) and conducting current ($I_{on}$) driving a load capacitance ($C_{load}$) up or down; at the same time the other device (the PFET) is off, not conducting (ideally modeled as an open switch) and, vice versa.

Increased chip density (the average density of circuit transistors on a chip), and chip die size has increased the number of transistors packed on a single chip; while features sizes have been shrunk to pack more transistors in the same area. Another state of the art approach to increasing FET density is forming FETs vertically on narrow semiconductor surface ridges or fins. Minimum feature sized lines of semiconductor material are formed on the surface of a bulk semiconductor wafer or from the surface layer of a silicon on insulator (SOI) wafer. The semiconductor lines or ridges form fins on the surface with gates formed on the fins for tightly packed vertical FETs. These vertical FETs are known as FinFETs. $I_{on}$ is directly related to the ratio of the device width to its length. Since FinFET width is limited in large part by fin height, designers form FinFET gates on multiple parallel connected fins to increase $I_{on}$ in FinFET. However, the narrow parallel fins form non-planar source and drain regions that make contacting FinFET source/drains conduction regions challenging.

One state of the art approach to contacting multi-fin FET source/drains, typically referred to as merged fin, involves epitaxially growing a semiconductor layer that merges the fins at source/drain regions. This epitaxial layer provides a uniform, planar surface for forming source/drain contacts. Another state of the art approach, typically referred to as unmerged fin, involves epitaxially growing semiconductor on pitched fins without the epi merging. Instead, the epi forms individual, diamond shaped source/drain regions at each fin. Contacts are formed to these unmerged diamond shaped source/drain regions. Contacts to these unmerged source/drains typically have a higher contact surface area that, when silicided, exhibits lower contact resistance ($R_s$) than merged fin contacts, in some instances significantly lower. Because unmerged fin contacts form along the oblique epi source/drain regions sides, unmerged fins tend to exhibit higher parasitic capacitance.

Both source/drain contact resistance and parasitic capacitance impair performance. $R_s$ is a series resistance that adds to device on impedance, and as such, reduces drive voltage ($V_{dd}-I_{on}R_s$) and adds stage delay ($R_sC_{load}$). Parasitic capacitance adds to stage input and output capacitance which adds to load capacitance at both stages, and couples input and output to reduce driving signals.

Thus, there is a need for reducing FinFET contact resistance and parasitic capacitance, and more particularly, for FinFETs with low, unmerged-fin contact resistance but also with the lower merged fin parasitic capacitance.

SUMMARY OF THE INVENTION

In an aspect of embodiments of the invention FinFET Integrated Circuit (IC) chip performance is improved;

In another aspect of embodiments of the invention contact resistance is reduced in low parasitic capacitance multi-fin FinFETs;

In yet another aspect of embodiments of the invention parasitic capacitance in low contact resistance multi-fin FinFETs is improved;

In yet another aspect of embodiments of the invention contact resistance and parasitic capacitance is minimized in multi-fin FinFETs for improved Integrated Circuit (IC) chip performance.

Embodiments of the invention relate to a method of forming field effect transistors (FETs), and forming integrated circuit (IC) chip including the FETs. Gates are formed on said semiconductor fins to define multi fin field effect transistors (FinFETs). Dielectric sidewalls on fins protect the sidewalls while the surface is damaged intentionally, e.g., with a non-doping implant that leaves source/drain junctions undisturbed. The non-doping implant only causes shallow damage to crystalline bonds, forming shallow surface pockets, e.g., less than 25% the total fin height. After removing the dielectric sidewalls semiconductor material is grown epitaxially on the sidewalls with the crystalline damage retarding growth on the surface. The epi-growth forms bridges between fins in the same FET. After the crystalline damage is repaired, e.g., through a rapid thermal anneal (RTA), chip fabrication continues normally.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
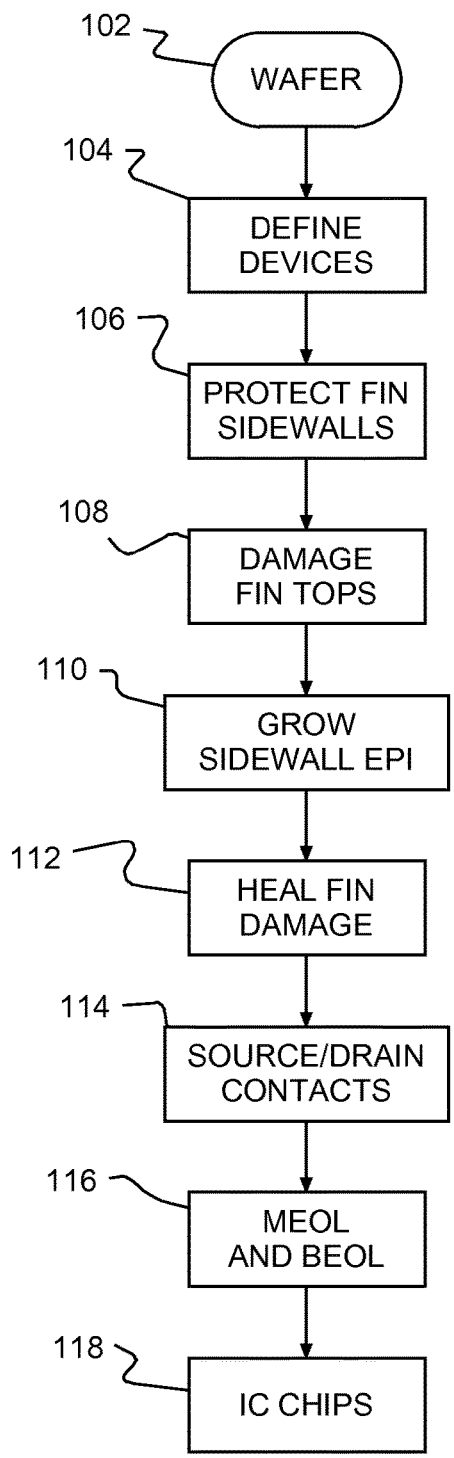
FIG. 1 shows an example of a preferred method for forming field effect transistors (FETs) and, more particularly bridged epi FinFETs, according to embodiments of the invention.

Turning now to the drawings and, more particularly, FIG. 1 shows an example of a preferred method of forming field effect transistors (FETs), e.g., in an integrated circuit (IC), and more particularly, forming bridged epi FinFETs, according to preferred embodiments of the invention. As CMOS fabrication features shrink to fourteen nanometer (14 nm) and below, IC fabrication primarily uses FinFETs. With these diminishing features sizes, fin pitches close to the point that even for unmerged FinFETs the epitaxially grown semiconductor on the tightly-pitched fins tend to bridge, increasing gate to drain/source parasitic capacitance. Drain/source parasitic capacitance ($C_{gs}$, $C_{gd}$) is the main effective capacitance ($C_{eff}$) component. Embodiments of the present invention reduce effective capacitance by reducing the bridged epitaxially grown semiconductor height. Thus, the bridged epi reduces FinFET gate to drain/source parasitic capacitances and improves cumulative circuit and chip performance.

Fabrication begins in step 102 with providing a typical semiconductor wafer. In step 104 chip devices (FETs) are defined, e.g., by defining or forming fins in/on a surface layer, forming a gate dielectric layer on the surface, a gate layer on the gate dielectric layer and defining gates on the fins. In step 106, forming gate sidewall spacers also forms spacers along the fins with the fin surface exposed at source/drain regions. At this point source/drain regions may be formed, e.g., implanting suitable dopant.

In step 108, the exposed source/drain fin surface is damaged intentionally, e.g., implanted/bombarded with a neutral material. After removing spacers from along the fins to re-expose fin sidewalls, the surface damage retards/prevents epi growth on the surface. In 110 semiconductor is grown epitaxially on the exposed fins sidewalls, bridging at minimum pitch fins with shallow valleys remaining between the damaged surfaces. In 112 the fin surface damage is healed, e.g., using a rapid thermal anneal (RTA). In step 114 contacts are formed to healed source/drain regions. In step 116 chip and device processing continues replacing dummy semiconductor gates with metal to complete the RMG FinFETs and through normal back end of the line (BEOL) steps to complete Integrated circuit (IC) chip definition 118.

Figure 2A:
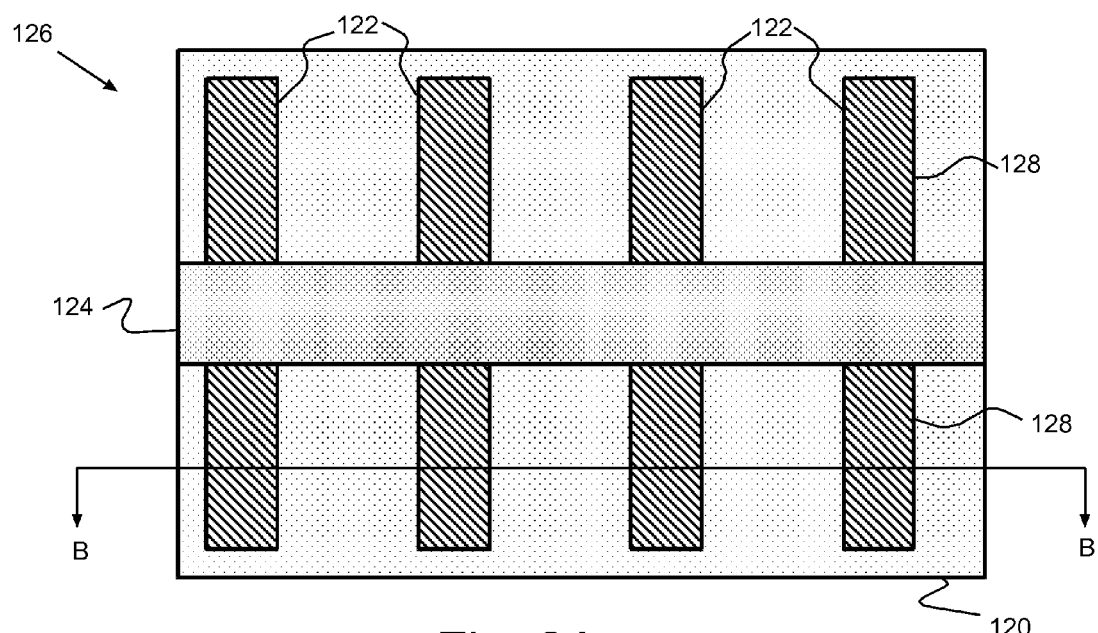
FIGS. 2A-2B show an example of a plan view and cross sectional view of a wafer with surface fins and a gate defining a device.
Figure 2B:
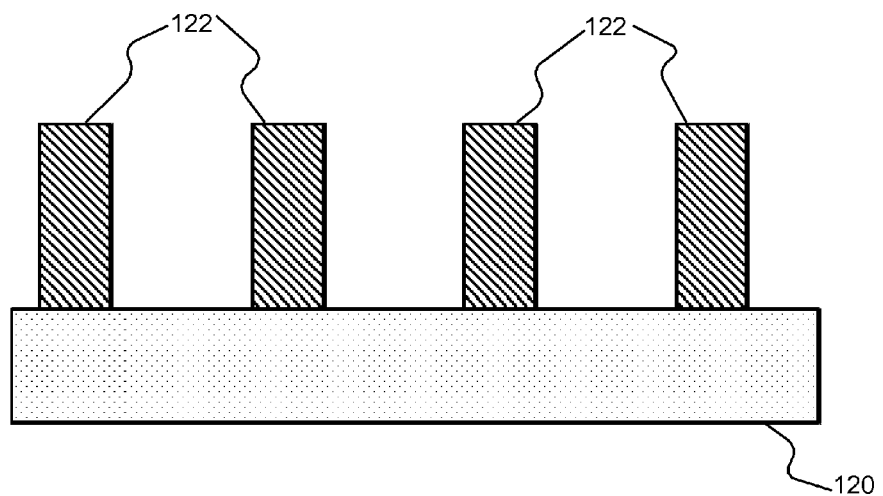

FIGS. 2A-B show an example of a wafer 120 (102 in FIG. 1) with surface fins 122 and a gate 124 defining a device 104 in a device location 126, and a cross section through the fins 122 at B-B. The wafer 120 may be, for example, a bulk silicon or III-V semiconductor wafer, a silicon on insulator (SOI) wafer or a wafer including Silicon-germanium with germanium percentage varying from 10-90%. The surface fins 122 are formed at the wafer surface, in the bulk surface or from a surface layer, using a state of the art fin formation technique, e.g., masking with a lithographic mask and etching using, for example, a reactive ion etch (RIE). Preferably, the fins 122 are 20-70 nanometers (20-70 nm) tall and 6-20 nm thick/wide on a 20-60 nm pitch, and most preferably, 45 nm tall by 10 nm thick/wide on a 30 nm pitch. The gate 124 defines fin channels between source/drain regions 128.

After forming the fins 122, gates 124 are formed on the fins 122. Preferably, the gates 124 sacrificial or dummy gates are semiconductor material, e.g., polysilicon, formed for replacement metal gate (RMG) devices. Typical semiconductor dummy gates are formed by forming a gate dielectric layer (e.g., silicon oxide (SiO) or oxide) on the wafer, depositing a polysilicon layer, and lithographically patterning the polysilicon layer. After patterning the gates, sidewall spacers (not shown) are formed along the gate sidewalls, typically for defining source/drain extensions.

Figure 3:
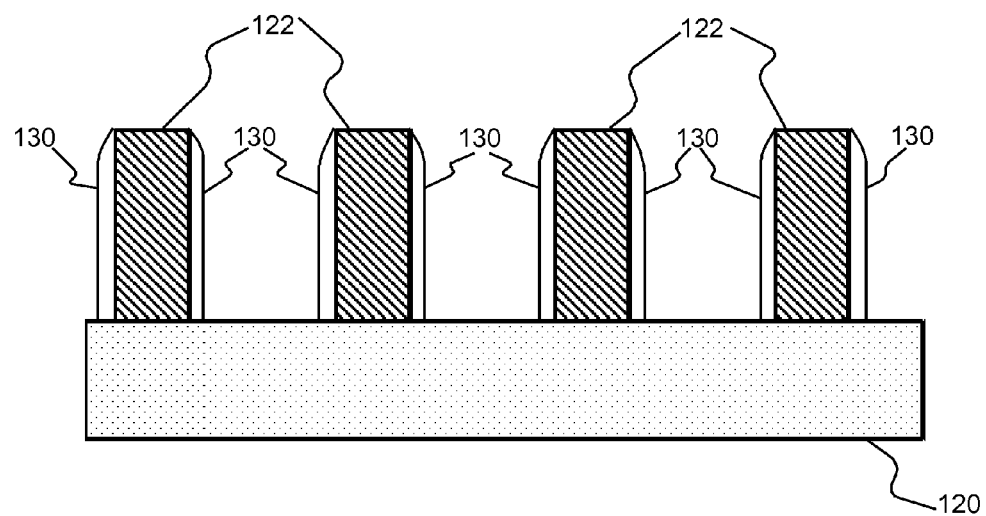
FIG. 3 shows an example of forming sidewall spacers along the fins.

FIG. 3 shows an example of the step 106 in FIG. 1 of forming sidewall spacers 130 along the fins 122 in the cross section of FIG. 2B with like elements labeled identically. When gate sidewall spacers are formed, sidewall spacers 130 also form along the fin sidewalls. Preferably, the spacers 130 are formed by depositing a 6-20 nm thick conformal nitride layer, most preferably 10 nm thick, and etching directionally, e.g., using a RIE, to remove horizontal portions of the nitride layer. Removing horizontal spacer layer leaves sidewall spacers 130 along the fins 122, exposing source/drain regions in the upper fin surface 132. Preferably, at this point the exposed fins are doped and diffused with a suitable dopant depending on the intended FinFET type, i.e., NFET or PFET.

Figure 4:
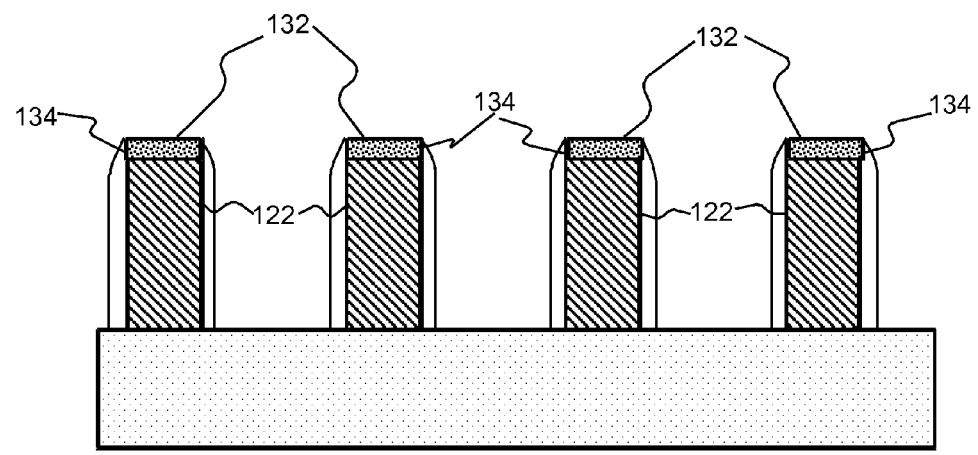
FIG. 4 shows an example of an intentionally damaged, exposed fin surfaces.

FIG. 4 shows an example of an intentionally damaged pockets 134 at exposed fin surfaces 132, damaged in step 108 in FIG. 1. Preferably, the surface 132 is damaged by implanting with a non-doping material, such as xenon (Xe) or silicon, to disrupt surface crystalline bonds, forming a non-crystalline surface pocket 134. The non-doping material only damages crystalline bonds 2 nm deep into the fins 122, forming 10 nm thick surface pockets 134 without impacting the source/drain junctions.

Figure 5:
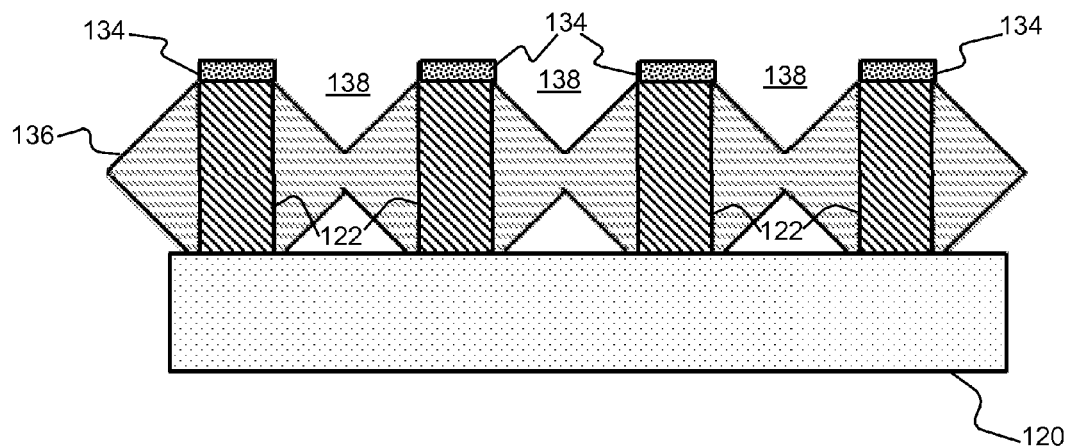
FIG. 5 shows an example of epitaxially growing semiconductor on the fins with non-crystalline surface pockets retarding/preventing surface epi growth.

FIG. 5 shows an example of semiconductor 136 epitaxially grown (110 in FIG. 1) on the fins 122 in a state of the art dual epi growth step with damaged surface pockets 134 retarding/preventing surface epi growth. Preferably phosphorus or arsenic-doped silicon (Si) is grown on NFET fins and boron-doped silicon germanium (SiGe) is grown on PFET fins. First the spacers are removed, e.g., with a suitable dry etch or wet etch for the selected spacer material. Removing the spacers re-exposes the fin sidewalls. Epitaxial growth 136 occurs on the exposed single crystal, sidewalls, but not on the non-crystalline surface pockets 134. Further, the epitaxial sidewall growth 136 is such that the growth from adjacent fins meet and bridge between the fins, forming shallow valleys 138 between the fins 122.

Figure 6A:
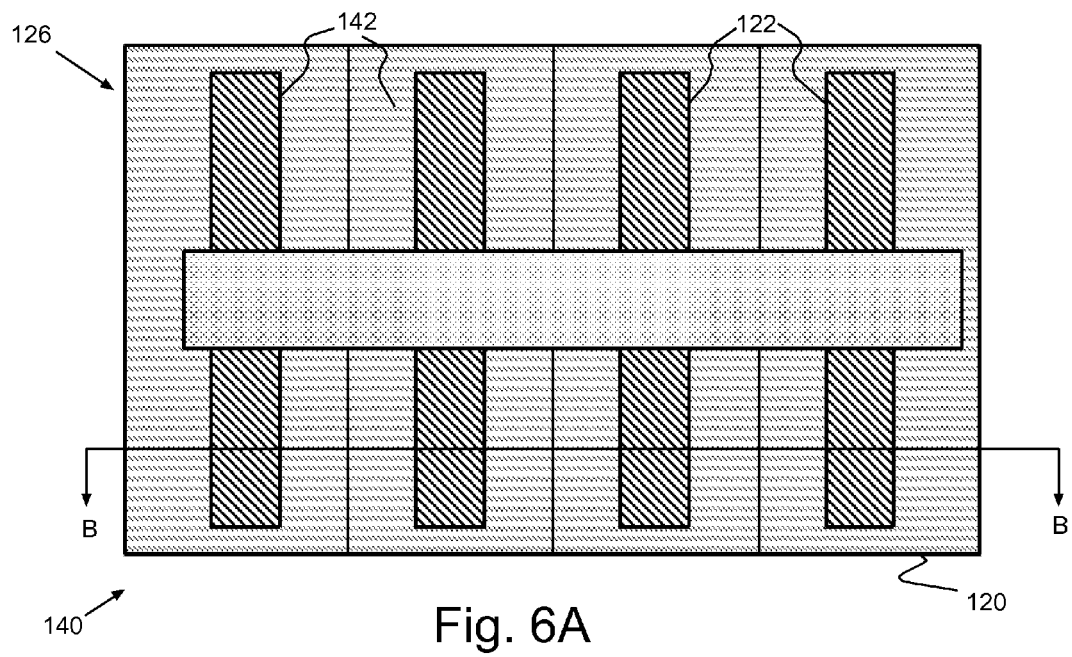
FIGS. 6A-6B show a plan view and cross-sectional view example with completed, preferred source/drain regions after re-crystallizing the surface pockets.
Figure 6B:
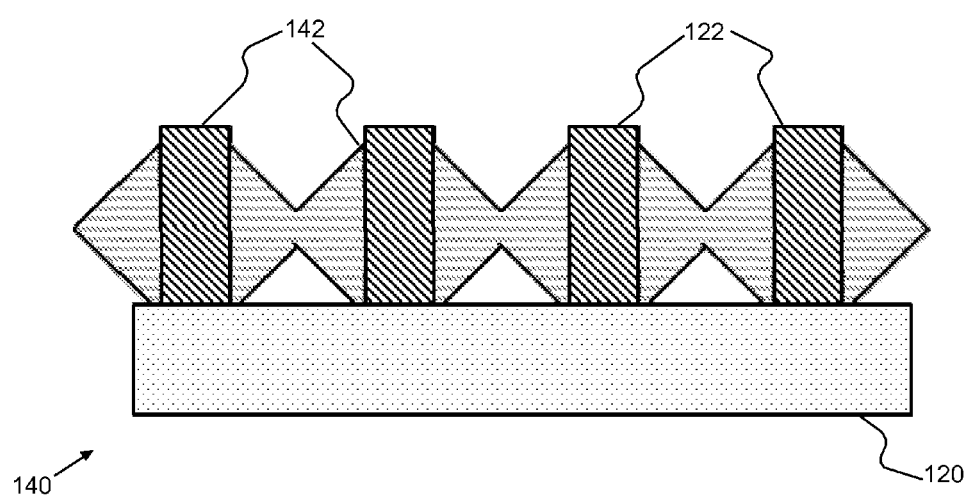

FIGS. 6A-B show a plan view example and a cross-sectional view example through B-B of FinFET 126 with completed, preferred source/drain regions 142 after re-crystallizing the surface pockets in step 112 in FIG. 1. Preferably, the surface pockets are re-crystallized using a typical high-temperature rapid thermal anneal. Subsequently, the epi and re-crystallized surface 142 is silicided using a typical state of the art silicide formation step with source/drain contacts formed to the silicide in step 114. The resulting preferred source/drain regions 142 have greater surface area than prior merged FinFETs, providing lower source/drain contact resistance that approaches unmerged FinFETs. Coincidentally, the preferred source/drain regions 142 have smaller cross-sectional area than merged FinFETs for reduced gate to source/drain capacitance, and lower resulting $C_{eff}$.

Figure 7:
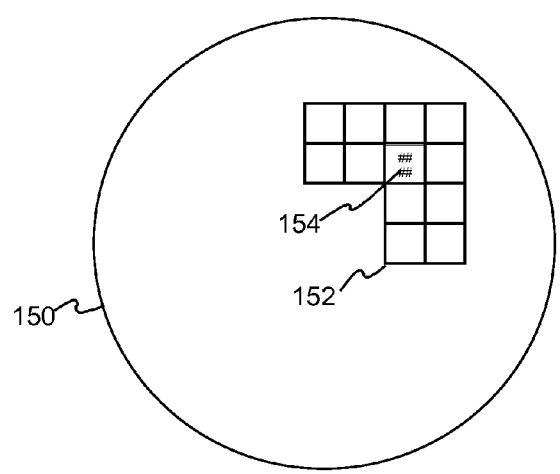
FIG. 7 shows an example of a wafer with completed IC chips after normal BEOL and chip definition with devices wired together and into circuits that are connected to pads and off chip.

FIG. 7 shows an example of a wafer 150 with completed IC chips 152 after normal BEOL and chip definition (116 and 118 in FIG. 1). After forming source/drain contacts and replacing dummy gates with metal in 114, wiring layers are formed using a suitable metal formation process, e.g., in a dual damascene metal line formation step, to connect FinFETs 116 into circuits. The metal lines on upper layers (not shown) wire chip FETs into chip circuits 154 and chip circuits 154 together. One or more of the connected circuits 154 includes at least one preferred FinFET.

Advantageously, preferred FinFETs have resulting source/drain regions with greater surface area than prior merged FinFETs, for lower source/drain contact resistance that approaches unmerged FinFETs. Further, preferred FinFETs have source/drain regions with smaller cross-sectional area than unmerged FinFETs for reduced gate to source/drain capacitance, and lower resulting $C_{eff}$. Reduced contact resistance and lower $C_{eff}$ provides higher overall (faster) chip performance at lower power consumption.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming fin field effect transistors (FinFETs), said method comprising:
   forming fins on a semiconductor wafer;
   forming gates defining field effect transistors (FETs) on said fins, conduction regions being exposed in said fins at both ends of each gate, at least one FET including a plurality of said fins;
   forming dielectric sidewalls on said semiconductor wafer, said dielectric sidewalls forming on sidewalls at said conduction regions of each fin;
   damaging the upper surface of said conduction regions in each of said fins;
   epitaxially growing semiconductor material (epi) on said fin sidewalls, the fin damage retarding epi growth on said fin upper surfaces, epi merging between fins in each of said plurality of fins; and then
   repairing damaged fin upper surfaces.

2. The method of forming FinFETs as in claim 1, wherein damaging said the upper surfaces comprises implanting the exposed fin upper surfaces with a neutral material.

3. The method of forming FinFETs as in claim 2, wherein said neutral material is selected from a group comprising silicon and xenon.

4. The method of forming FinFETs as in claim 2, before damaging said exposed fin upper surfaces, said method further comprising forming said conduction regions in said fins, the upper surface of said conduction regions being damaged without disturbing conduction region junctions.

5. The method of forming FinFETs as in claim 1, wherein said dielectric sidewalls maintain said fins substantially undamaged beneath said surface, and growing epi comprises:
   removing said dielectric sidewalls from said fins to re-expose fin sidewalls;
   epitaxially growing a first semiconductor material on exposed sidewalls for a first type FETs; and
   epitaxially growing a second semiconductor material on exposed sidewalls for a second first type FET.

6. The method of forming FinFETs as in claim 5, wherein said first semiconductor material is silicon (Si), said first type FETs are NFETs, and said second semiconductor material is silicon germanium (SiGe) and said second type FETs are PFETs.

7. The method of forming FinFETs as in claim 1, wherein repairing fin damage comprises annealing said wafer in a rapid thermal anneal (RTA).

8. The method of forming FinFETs as in claim 1, further comprising:
   forming silicide on conduction regions, said silicide forming on repaired said fin upper surfaces and on bridged epi; and
   forming contacts to said silicide.

9. The method of forming FinFETs as in claim 8, further comprising connecting a plurality of said FinFETs into a circuit, at least one connected FinFET including a plurality of fins with said bridged epi.

10. A method of forming an integrated circuit (IC) including a plurality of FinFETs, said method comprising:
    forming surface fins on a semiconductor wafer;
    forming gates defining field effect transistors (FETs) on said fins, a plurality of said FETs including a plurality of said fins;
    forming dielectric sidewalls on said semiconductor wafer, said dielectric sidewalls forming on sidewalls of each fin;
    forming conduction regions in said fins at both ends of each gate;
    damaging the exposed upper surface of each of said conduction regions;
    removing said dielectric sidewalls from said fins at said conduction regions to re-expose fin sidewalls;
    epitaxially growing semiconductor material (epi) on said fin sidewalls, fin damage retarding epi growth on said exposed upper surfaces, epi merging between fins in said plurality of FETs; and then
    repairing damaged fin upper surfaces; and
    connecting said FETs into IC circuits.

11. The method of forming an IC as in claim 10, wherein growing epi comprises:
    epitaxially growing a first semiconductor material on exposed sidewalls for a first type FETs; and
    epitaxially growing a second semiconductor material on exposed sidewalls for a second first type FET, the fin damage retarding epi growth on said fin upper surfaces.

12. The method of forming an IC as in claim 11, wherein damaging said exposed upper surfaces comprises implanting said exposed upper surfaces with a neutral material, the implant damaging said exposed upper surfaces without disturbing conduction region junctions.

13. The method of forming an IC as in claim 12, wherein repairing fin damage comprises annealing said wafer in a rapid thermal anneal (RTA).

14. The method of forming an IC as in claim 13, connecting said FETs into IC circuits comprising:
    forming silicide on said conduction regions, said silicide forming on repaired upper surfaces and on bridged epi; and
    forming conduction region contacts to said silicide.

15. The method of forming an IC as in claim 14, connecting said FETs into IC circuits further comprising connecting FinFETs into a circuit, at least one said circuit including multiple FinFETs including fins with said bridged epi.

16. The method of forming an IC as in claim 15, wherein said first semiconductor material is silicon (Si), said first type FETs are NFETs, and said second semiconductor material is silicon germanium (SiGe) and said second type FETs are PFETs.

17. The method of forming an IC as in claim 16, wherein said fins are silicon formed in a silicon surface.

18. The method of forming an IC as in claim 17, wherein said semiconductor wafer is a silicon on insulator (SOI) wafer and said fins are formed in the surface silicon layer.

19. The method of forming an IC as in claim 17, wherein said neutral material is selected from a group comprising silicon and xenon.

* * * * *